United States Patent [19]

Iwasaki

[11] Patent Number: 5,434,805
[45] Date of Patent: Jul. 18, 1995

[54] TEST TIMING PROGRAM AUTOMATIC GENERATOR

[75] Inventor: Sachiko Iwasaki, Itami, Japan

[73] Assignee: Mitsubishi Denki Kabushiki Kaisha, Tokyo, Japan

[21] Appl. No.: 943,494

[22] Filed: Sep. 11, 1992

[30] Foreign Application Priority Data

Sep. 12, 1991 [JP] Japan ................. 3-232858

[51] Int. Cl.6 ............................................. G01R 31/26
[52] U.S. Cl. .................................. 364/580; 324/73.1; 364/579; 371/27
[58] Field of Search .................... 324/73.1, 158 R; 364/579, 580; 371/27

[56] References Cited

U.S. PATENT DOCUMENTS

| | | | |
|---|---|---|---|
| 3,082,374 | 3/1963 | Buuck | 364/579 X |
| 4,013,951 | 3/1977 | Ezoe et al. | 371/27 |
| 4,635,256 | 1/1987 | Herlein | 371/1 |
| 4,656,580 | 4/1987 | Hitchcock, Sr. et al. | 395/500 |
| 4,787,062 | 11/1988 | Nei et al. | 395/500 |
| 4,928,278 | 5/1990 | Otsuji et al. | 371/27 X |
| 4,977,531 | 12/1990 | Ogata et al. | 364/580 |
| 5,091,872 | 2/1992 | Agrawal | 364/578 |
| 5,198,758 | 3/1993 | Iknaian et al. | 324/73.1 X |
| 5,212,443 | 5/1993 | West et al. | 324/73.1 X |
| 5,268,639 | 12/1993 | Gasbarro et al. | 324/158 R |
| 5,311,486 | 5/1994 | Alton et al. | 324/73.1 X |
| 5,321,700 | 6/1994 | Brown et al. | 371/27 |
| 5,321,702 | 6/1994 | Brown et al. | 371/27 |
| 5,323,401 | 6/1994 | Maston | 371/27 |
| 5,325,053 | 6/1994 | Gasbarro et al. | 324/158 R |

*Primary Examiner*—Edward R. Cosimano
*Attorney, Agent, or Firm*—Oblon, Spivak, McClelland, Maier & Neustadt

[57] ABSTRACT

A test timing condition setting program generator for automatically generating a test timing condition program. Waveforms indicating product inspection specifications are input using a waveform input editor, a timing value being attached to each waveform. Using the timing values, an intermediate data generation unit generates intermediate data. Though format of the intermediate data is converted into a test program format acceptable to a particular semiconductor tester by a translator, thereby automatically generating a source program of a test timing condition setting program.

9 Claims, 12 Drawing Sheets

```
   /RAS    tRAS(L0E-L1S)=111
   /CAS    tRCD(L0E-L2E)=222   tCAS(L2E-L3S)=333
   ROW     tASR(L6E-L0S)=444
   COL     tCAH(L2E-L4S)=555
   STB  S STB(L0E-L5E)=666
SETTIME /RAS 777
```

```
/RAS    tRAS(L0E-L1S)=100 tRAS(L2E-L3S)=150
  :
SETTIME /RAS 20
```

BEGINNING OF TEST CYCLE    $\alpha \geq 10ns$    END OF TEST CYCLE

RASS0=20ns

ROWS0=10ns    ROWE0=50ns

STB0=58ns     RATE0=58ns

ROWS1=20ns

FIG.17

RASS0=20ns

ROWS0=10ns     ROWE0=50ns

STB0=58ns      RATE0=60ns

ROWS1=18ns

TEST TIMING PROGRAM AUTOMATIC GENERATOR

BACKGROUND OF THE INVENTION

1. Field of the Invention

The present invention relates to a test timing condition setting program automatic generator for automatically generating a test timing condition setting program which defines a test timing condition of a test program for a semiconductor device.

2. Description of the Background Art

FIG. 1 is a flowchart showing conventional programming steps of a test program for testing a semiconductor device. In Step S1, product standards (product specifications) are prepared. Among those included in the product standards is, for example, the product standards include a maximum allowable time or a minimum allowable time from the start of a fall of a RAS signal to the start of a fall of a CAS signal if a semiconductor device to be tested is a memory IC. Next, an engineer generates a product inspection specification sheet in accordance with the product standards (Step S2). The product inspection specification sheet is used in inspecting a device to ensure that the device satisfies the product standards. Therefore, the product inspection specification sheet defines various specifications including test items, test patterns for the respective test items, test timings, voltage conditions and which pin to designate, In line with the contents of the product inspection specification sheet, the engineer carries out coding (Step S3) and editing (Step S4) to write a source program (Step S5). A source program is a test program for testing a semiconductor device and is written in a high-level language. To code is to write a source program on a desk, and to edit is to key the source program from a terminal component of a computer.

In Step S6, the source program is compiled by a compiler; in other words, the source program written in a high-level language into a program written in a computer language is translated so as to make it acceptable to the testing machine of a semiconductor device (semiconductor tester). By thus compiling the source program, an object program is produced (Step S7). Through the compiling, it is possible to find some of programming errors, if not all, in the source program such as an editing error. Programming errors, if any, are rectified by re-editing alone or re-coding and re-editing in combination in this order.

The test program has not been completed yet even though the object program of the test program is thus produced by compiling, because chances cannot be denied that the object program will not normally function precisely as it should. To eliminate this uncertainty thereby completing the test program, the object program is usually debugged (Step S8). That is, the engineer lets the test program to run on an actual device (semiconductor tester), finds a programming error, and removes the error. In most cases, correction of programming errors found during debugging must be made to the source program. This means another round of programming error correction being required to complete the test program in the form of the object program: re-coding and re-editing thereby correcting the source program, followed by re-compiling of the corrected source program.

In the field of semiconductor devices, memory ICs especially, recent years have seen rapidly increasing needs for higher degree of integration and diversification of products. To catch up with the change due to the acute integration and diversification, test programs for testing such devices must be revised more frequently than before. On the other hand, as described above, a test program requires manual labor of a programming engineer except for compiling. As a result, the semiconductor industry is now being challenged by serious shortage of programming engineers of a test program. To add to the difficulty, a test program which is becoming increasingly complicated inevitably includes a number of programming errors.

To deal with these problems, various systems for automatically generating a test program have been proposed and some of them are already in the process of actual development. However, since some types of semiconductor devices, memory ICs in particular, require an extremely complicated test program, such semiconductor devices as memory ICs are rather behind the other types of semiconductor devices which demand a less complicated test program in development of automatic test program generating systems. A test program for a memory IC is roughly divided into a main program and a sub program. The sub program consists of a test pattern program, a test timing condition setting program, a voltage condition program and a pin designation program, and are under the control of the main program. Among the four programs of the sub program, the test timing condition setting program which defines a test timing condition of the test program needs revision most frequently and takes a quite long programming time.

SUMMARY OF THE INVENTION

The present invention relates to a test timing condition setting program automatic generator for automatically generating a test timing condition setting program which defines a test timing condition of a test program for a semiconductor device, comprising: input means for inputting product inspection specification data, the product inspection specification data being data related to a timing of test signals which are given to the semiconductor device during a test of the semiconductor device, the product inspection specification data including set time data which defines a test start timing; memory means for storing information about a predetermined check item regarding which the product inspection specification data is checked; intermediate data generating means for checking the product inspection specification data which is inputted using the input means with regard to the check item which is stored in the memory means and, when the check item is satisfied, converting the product inspection specification data into intermediate data in accordance with the set time data, the intermediate data being data written in terms of timing in which the test start timing is used as a reference timing; and conversion means for converting a format of the intermediate data into a test program format acceptable to a particular semiconductor tester thereby producing a source program of the test timing condition setting program.

Thus, the source program of the test timing condition setting program is automatically produced only by inputting the product inspection specification data using the input means. Hence, coding and editing do not require manual labor of an programming engineer. As a result, programming errors are prevented and programming time is reduced.

In an aspect of the present invention, the input means includes a waveform input editor for inputting waveforms of the test signals, the waveforms of the test signal being inputted as image information. In addition, inspection standard information is attached to each one of the waveforms inputted as image information using the input means, the inspection standard information being indicative of a time duration between preselected timings. Further, the waveform input editor generates the product inspection specification data in accordance with the inspection standard information.

Thus, using the waveform input editor, at the same time that patterns of the waveforms of the test signals are inputted as image information, timings can be attached to the image information of the test signals, thereby labor associated to inputting is eased.

In another aspect, the test signals include a reference signal designated as a reference for timing division. Further, the intermediate data generating means carries out timing division of the test signals in such a manner that a timing of the timing division is in accordance with a timing of the reference signal, and generates the intermediate data suitable to the test signals.

Thus, designating one of the test signals as the reference signal and executing timing division in accordance with the reference signal, it is possible to automatically generate a test timing program for a test program which includes a plurality of test cycles.

In a still another aspect, the intermediate data generating means checks the product inspection specification data for each test signal as timing-divided to find whether the check item is satisfied. If the check item is not satisfied, the intermediate data generating means amends the product inspection specification data so that the check item can be satisfied and then produces the intermediate data.

Thus, amending the product inspection specification data in the intermediate data generating means after timing division, a defective timing created as a result of the timing division is corrected in an automatic manner, whereby programming is simplified.

These and other objects, features, aspects and advantages of the present invention will become more apparent from the following detailed description of the present invention when taken in conjunction with the accompanying drawings.

BRIEF DESCRIPTION OF THE DRAWINGS

FIG. 17 shows intermediate data as amended so that the test program passes the tester restriction check.

DESCRIPTION OF THE PREFERRED EMBODIMENTS

Figure 2:
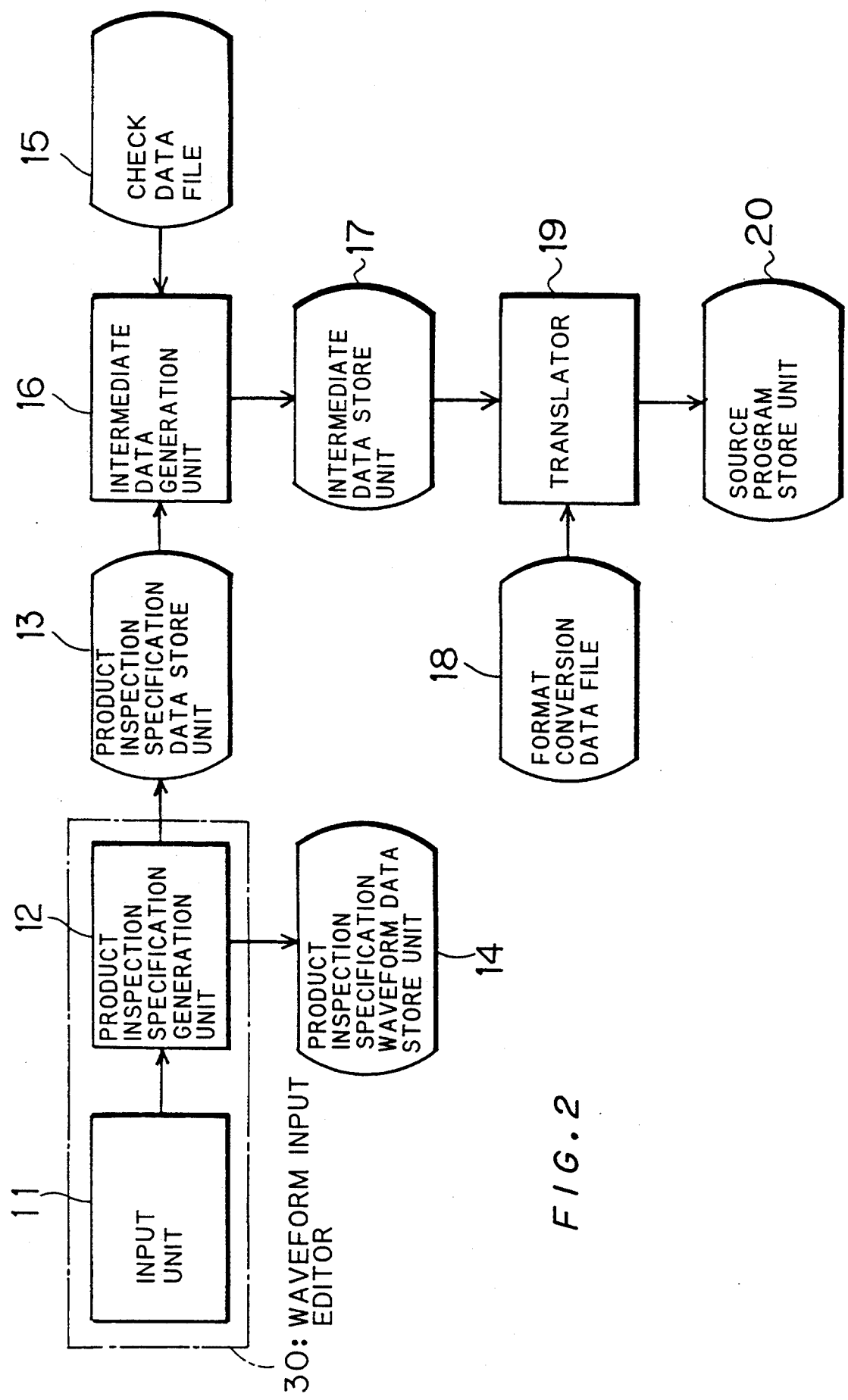
FIG. 2 is a block diagram of a test timing condition setting program automatic generator according to a preferred embodiment of the present invention.

FIG. 2 is a function block diagram of a test timing condition setting program automatic generator according to a preferred embodiment of the present invention. The function as illustrated in FIG. 2 is realized using a computer structure of which is diagrammatized, for example, as FIG. 3.

Figure 3:
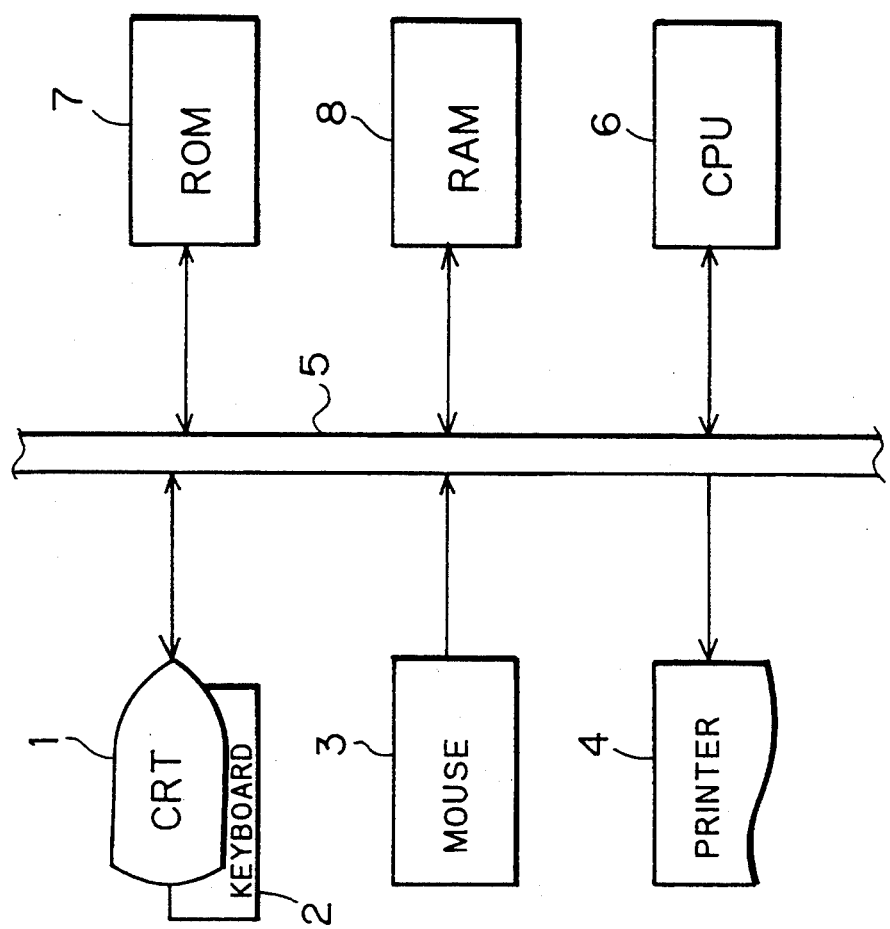
FIG. 3 is a block diagram of a computer with which the test timing condition setting program automatic generator of FIG. 1 is realized.

In FIG. 3, an input/output unit, that is, a CRT 1, a keyboard 2, a mouse 3 and a printer 4 is connected to a CPU 6 through a bus 5. Likewise, a ROM 7 and a RAM 8 are connected to the CPU 6 through the bus 5. A program for realizing the function of automatically producing a test timing condition setting program according to the present invention is stored in either the ROM 7 or the RAM 8. The CPU 6 operates as instructed by the program stored in the ROM 7 or the RAM 8, thereby realizing the function as illustrated in FIG. 2.

Figure 8:
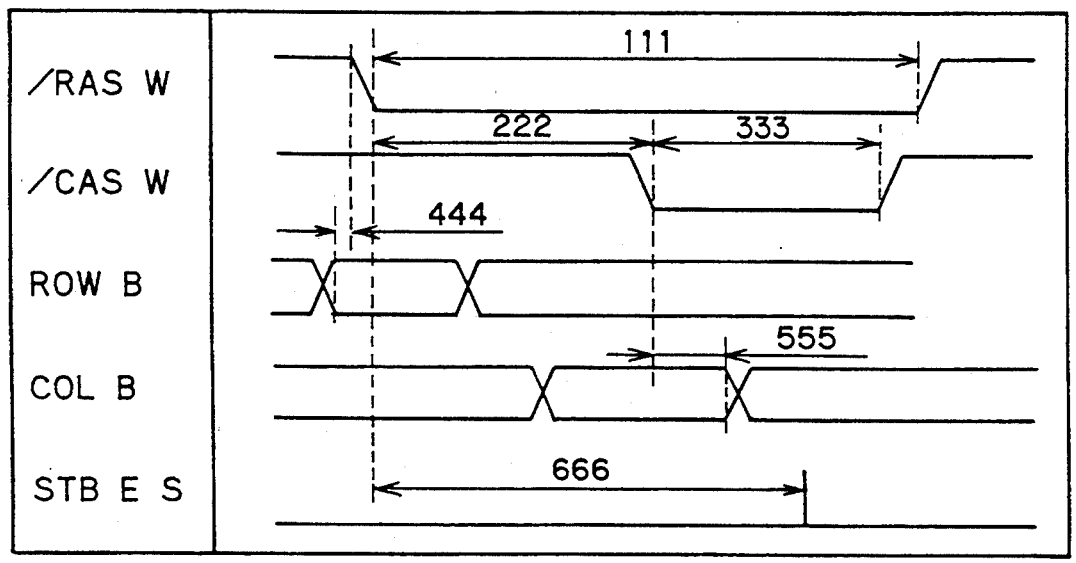
FIG. 8 is an explanatory diagram showing how product inspection specification waveform data is displayed on a display screen.

The test timing program automatic generator of FIG. 2 comprises a waveform input editor 30. The waveform input editor 30 comprises an input unit 11 which corresponds to the CRT 1, the keyboard 2 and the mouse 3. The waveform input editor 30 also comprises a generation unit 12 for producing product inspection specification data (FIG. 6) and product inspection specification waveform data (FIG. 8). The generation unit 12 generates the two forms of data based on data inputted at the input unit 11.

The product inspection specification data is stored in a store unit 13 while the product inspection specification waveform data is stored in a store unit 14. The product inspection specification data is information about a timing to give a test signal to a semiconductor device during a test, and includes set time data (indicated as "SETTIME" in FIG. 6) which defines a test start timing.

Figure 14:
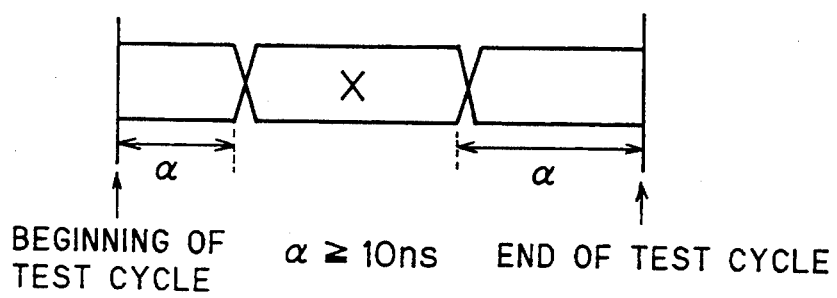
FIG. 14 is an explanatory diagram showing an example of a tester restriction.

Check items for checking the product inspection specification data are determined in advance and stored in a check data file 15. Among the check items are, for example, a check whether an input error of the product inspection standards exists (e.g., whether the engineer has forgotten to enter a necessary statement or entered overlapping statements with respect to the same matter although unnecessary) and a tester restriction check (FIG. 14).

Figure 13:
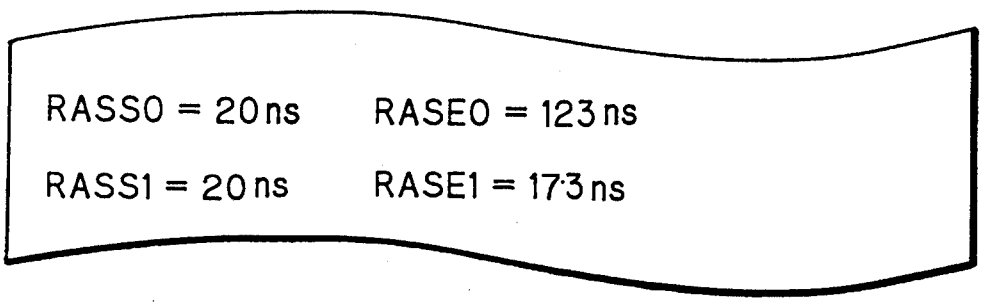
FIG. 13 shows intermediate data which corresponds to the data as shown in FIG. 12.

An intermediate data generation unit 16 checks the product inspection specification data stored in the store unit 13 for every check item stored in the check data file 15. If the result of the check finds no error in the product inspection specification data, the intermediate data generation unit 16 converts the product inspection specification data into intermediate data which defines the details of the test program in terms of timing (FIGS. 13 and 17). In the conversion, the set time data included in the product inspection specification data is used as reference information because the timings written in the intermediate data are taken from the start time of the test. The intermediate data thus produced is stored in an intermediate data store unit 17.

A format conversion data file 18 stores format conversion data defining details of format conversion by which the format of the intermediate data is converted into a test program format which is suitable for a particular semiconductor tester. According to the format conversion data stored in the format conversion data file 18, a translator 19 translates the format of the intermediate data stored in the store unit 17 into the test program format for the particular semiconductor tester. Consequently, a source program of the test program for the particular semiconductor tester is obtained. The source program thus generated is stored in a source program store unit 20.

Figure 4:
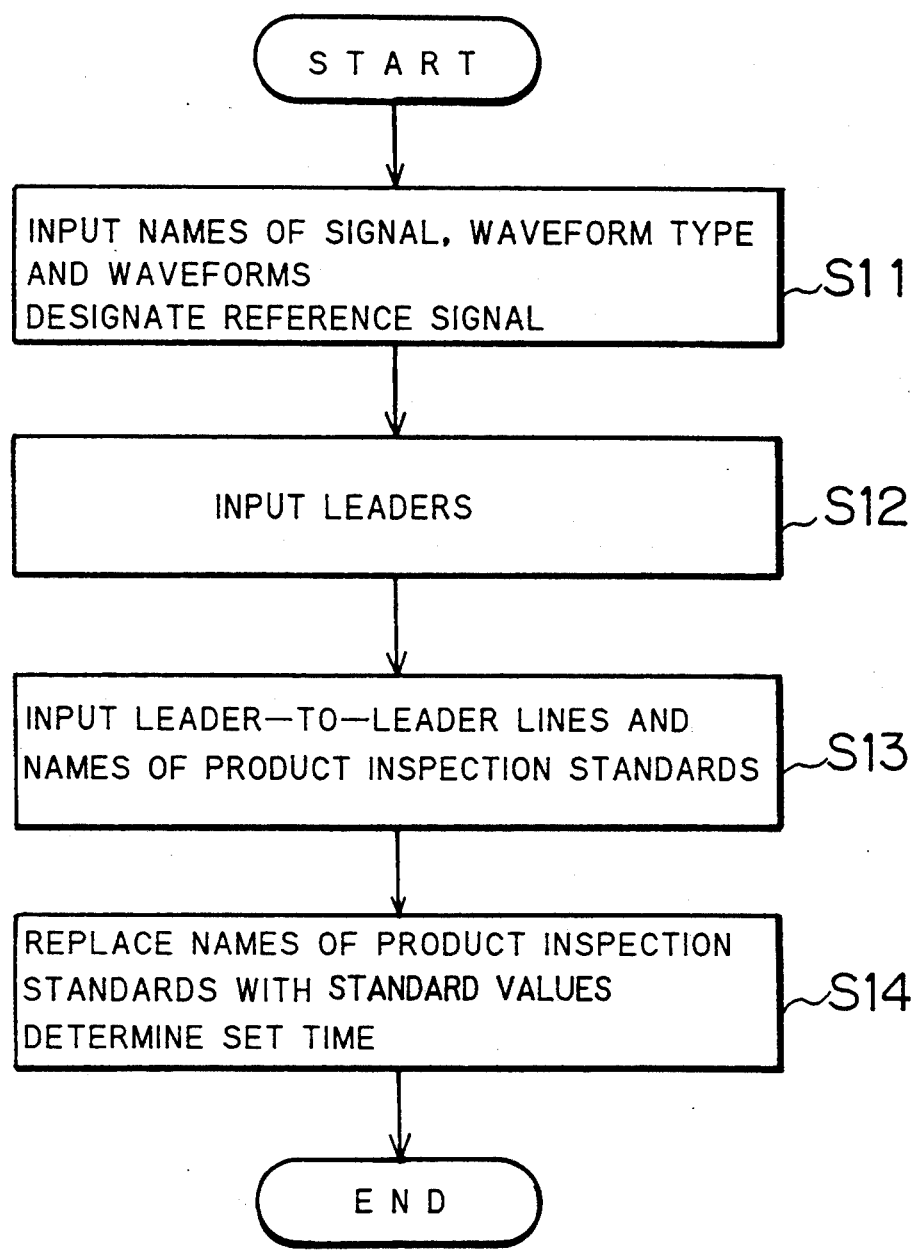
FIG. 4 is a flowchart showing operation flow in an input unit of the test timing condition setting program automatic generator of FIG. 1.
Figure 7:
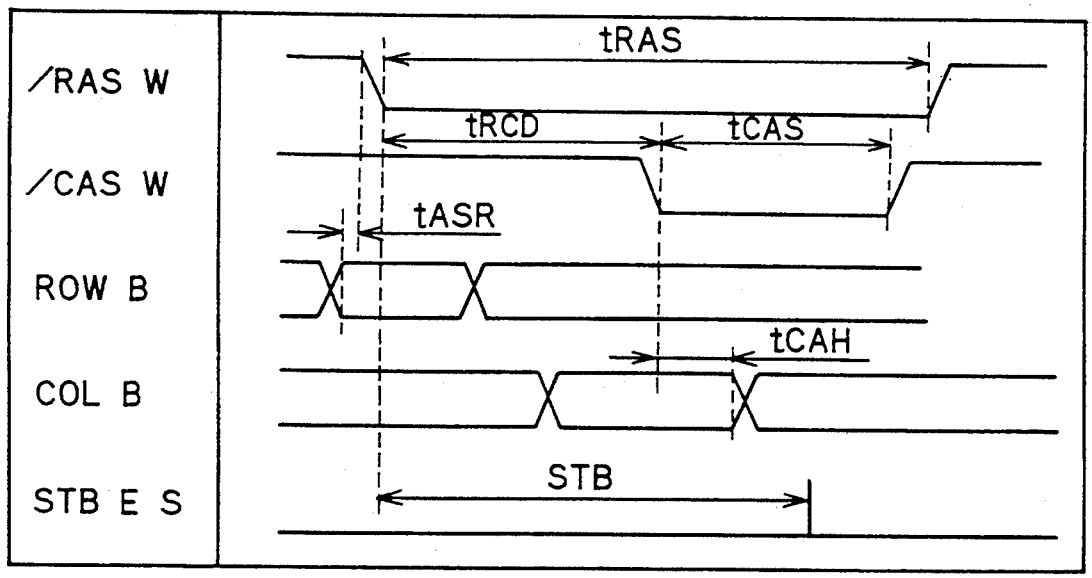
FIG. 7 is an explanatory diagram how waveforms are entered using the waveform input editor.

FIG. 4 is a flowchart showing operation flow in the input unit 11 of the waveform input editor 30 (FIG. 2). First, names, waveform types and actual waveforms of test signals are entered using the keyboard 2 and the mouse 3 (Step S11). This stage also requires to designate a reference signal for timing division. In FIG. 7, the CRT1 displays the names of the signals for the memory IC device as "/RAS," "/CAS," "ROW," "COL" and "STB." The name "/RAS" is attached to a row address strobe signal. Likewise, the name "/CAS" is attached to a column address signal, and the name "ROW" is attached to a row address signal, the name "COL" is attached to a column address signal. The name "STB" is attached to a strobe signal which defines a timing to judge readout data during a test of the memory IC device. On the other hand, the alphabet letters "W," "B" and "E" indicate waveform types; "W" for a wave pattern type, "B" for a bus pattern type and "E" for an edge pattern type. In addition, the alphabet letter "S" indicates that a signal is designated as the reference signal. In FIG. 7, the letter "S" is attached to the strobe signal STB. In this case, therefore, the strobe signal STB is used as the reference signal in timing division. (The timing division will be described in detail later.)

Figures 5, 6:
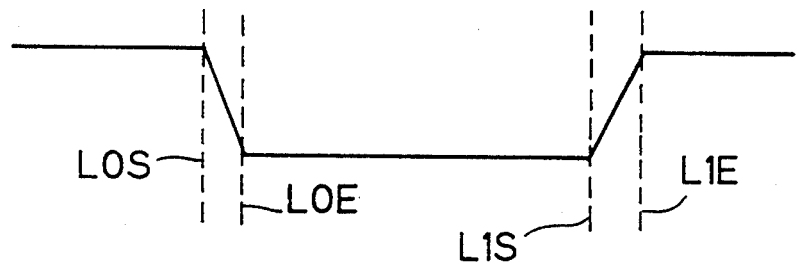
FIG. 5 is an explanatory diagram of a waveform which is inputted with a waveform input editor.
FIG. 6 is a diagram showing an example of product inspection specification data.

Next, leaders are added to the waveforms of the signals inputted in Step S11 (Step S12). In the preferred embodiment, the CRT1 displays the waveforms with solid lines and indicates the leaders with dotted lines as shown in FIG. 5. In FIG. 5, the symbols "LOS," "LOE," "L1S" and "L1E" are proper noun information of the leaders. If the symbol attached to a line includes the letter "L," that particular line is a leader. The numbers "0," "1" ... are serial numbers indicating the order in which the leaders are inputted. The letters "S" and "E" denote a beginning and an end of a change in a waveform, respectively.

In Step S13, a leader-to-leader line is added between the leaders which are entered in Step S12. In FIG. 7, the leader-to-leader lines are each indicated as a solid line with a sharp bent on the both ends. The leader-to-leader lines are then each provided with a symbol indicating a name of a product inspection standard; more precisely, the symbols "tRAS," "tRCD," "tCAS," "tASR," "tCAH" and "STB" in FIG. 7. The symbol "tRAS" defines a low level period of the signal /RAS, the symbol "tRCD" defines a period from the beginning of a fall of the signal/RAS to the beginning of a fall of the signal /CAS, and the symbol "tCAS" defines a low level period of the signal /CAS. The symbol "tASR" defines a set up time (a time when the ROW address must be derived prior to the fall of the signal /RAS). The symbol "tCAH" defines a period from the end of the fall of the signal/CAS to a time when the COL address terminates. The symbol "STB" defines an access time (a period from the end of the fall of the signal /RAS to a time when a readout signal is fixed). It is to be noted that FIG. 7 is what the CRT1 would display when Step S13 has been finished.

Figure 1:
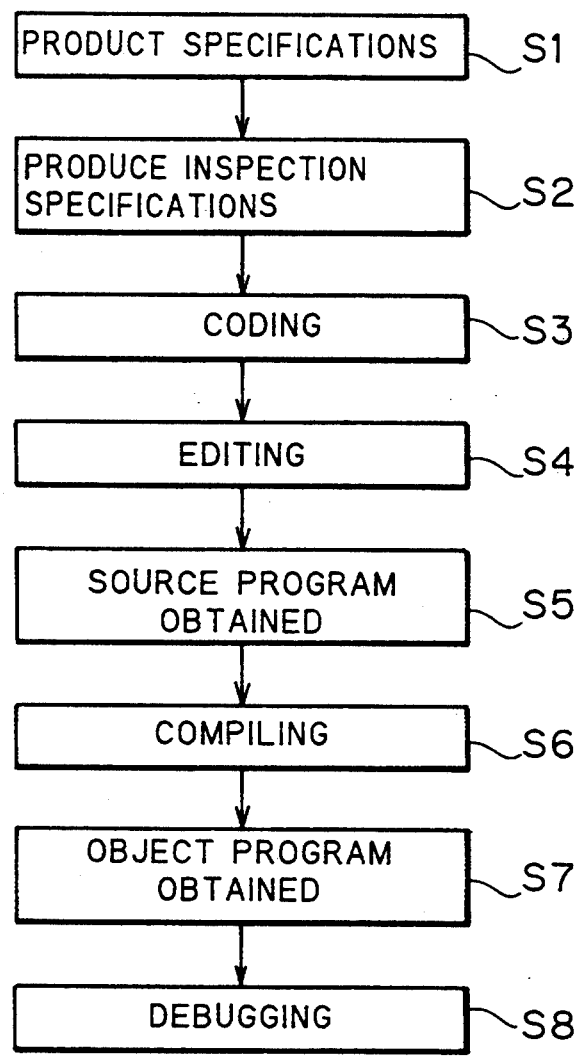
FIG. 1 is a flowchart showing conventional programming steps of a test program for a semiconductor device.

Lastly, the numerical values required for test signals (standard value) are inputted (Step S14), replacing the names of the product inspection standards which are inputted in Step S13. Step S14 also requires that a set time is determined which defines a test start timing (zero-time). The standard values to be entered in Step S14 must be determined so that the product standards (FIG. 1, Step S1) are satisfied. FIG. 8 shows what the CRT1 would display when Step S14 has been finished. In FIG. 8, the standard values are each indicated as a row of numerals with no substantial meaning in order to show only exemplary values, i.e., the symbols "111," "222" ... "666." Although the CRT1 does not display the names of the product inspection standards, the names of the product inspection standards and the standard values associated thereto are stored such that the relations therebetween are recognized by the CPU6. At this stage (FIG. 8), the set time is not displayed by the CRT1, either. However, information about the set time is incorporated in the product inspection specification data as set time data (FIG. 6, "SETTIME"). In the example of FIG. 6, the test program causes the signal /RAS to start falling when "777"-time has passed from the zero-time.

The generation unit 12 of the waveform input editor 30 produces the product inspection specification data and the product inspection specification waveform data based on the data entered at the input unit 11 in a manner as described above. The product inspection specification data is stored in the store unit 13 and the product inspection specification waveform data is stored in the store unit 14.

The product inspection specification waveform data corresponds to the data as displayed by the CRT1 at the stage of FIG. 8. The importance of storing the product inspection specification waveform data in the store unit 14 would be well appreciated when the product specifications of the semiconductor device are altered. By reading the product inspection specification waveform data from the store unit 14 and changing the standard values (111 to 666), the test timing program as amended in response to the change in the product specifications is automatically produced in an easy manner.

The product inspection specification data contains only timing-related information about the test signals, as shown in FIG. 8. FIG. 6 shows a part of the product inspection specification data which corresponds to the data as shown in FIG. 8. Thus, the product inspection specification data, or the timing-related data about the test signals is inputted at the same time that the waveforms indicating the product inspection specifications, i.e., the waveforms of the test signals are inputted, both using the waveform input editor 30. Hence, inputting is simplified in the preferred embodiment.

Figure 9:
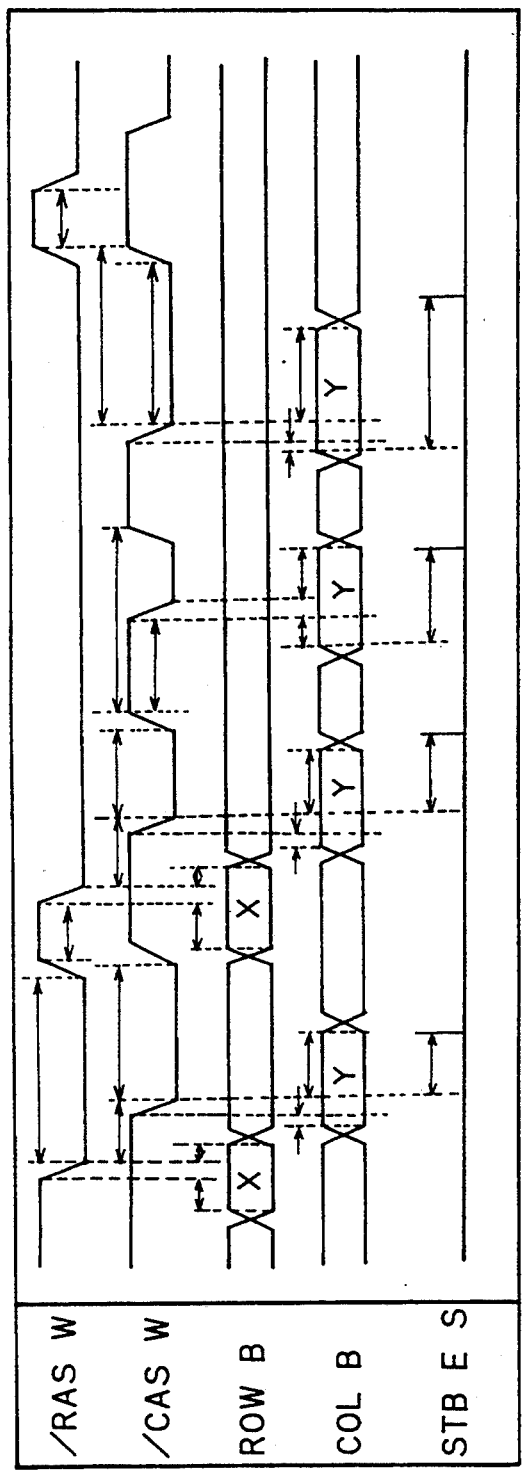
FIG. 9 is an explanatory diagram for explaining a case in which a test timing condition setting program utilizes a plurality of strobe signals which are used as a reference signal in timing division.

The foregoing has described the present invention in relation to where the strobe signal STB is used as the reference signal for timing division and only one strobe signal STB is required (FIGS. 7 and 8). Now, where a plurality of strobe signals STB are required will be described in the following. In the example of FIG. 9, four strobe signals STB are used. Though the number of the strobe signals differ, basic concept remains unchanged between the example of FIGS. 7 and 8 and the example of FIG. 9. In FIG. 9, the names of the product inspection standards (FIG. 7) and the standard values (FIG. 8) are simply omitted.

Figure 10:
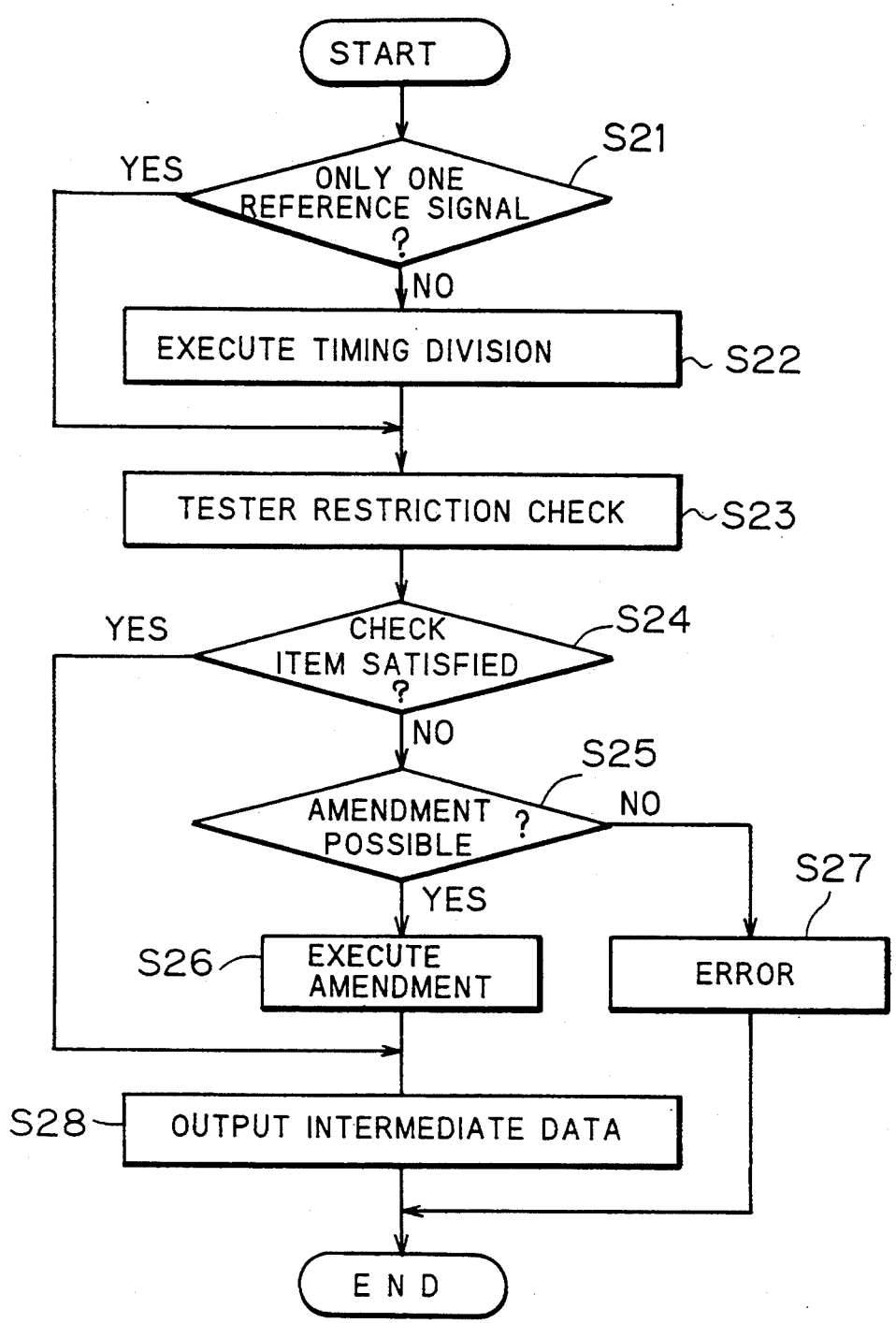
FIG. 10 is a flowchart showing operation flow in an intermediate data generation unit of the test timing condition setting program automatic generator of FIG. 1.

FIG. 10 is a flowchart showing operation flow in the intermediate data generation unit 16 of FIG. 2. In Step S21, it is found whether only one reference signal (strobe signal STB in the preferred embodiment) is used or more than one reference signals are used. As heretofore described, the strobe signal STB is, a signal which defines a timing to judge readout data during a test of the memory IC device. Hence, if only one strobe signal STB is found, the test program includes only one test cycle. If the test program includes only one test cycle, timing division of the test signals is not necessary, and therefore, the operation flow is allowed from Step S21 to Step S23.

On the contrary, if a plurality of strobe signals STB are found, test program should include a plurality of test cycles. Hence, Step S22 must be executed in which the test signals are timing-divided to thereby produce a test timing condition setting program which defines test timings for the respective test cycles.

Figures 11, 12:
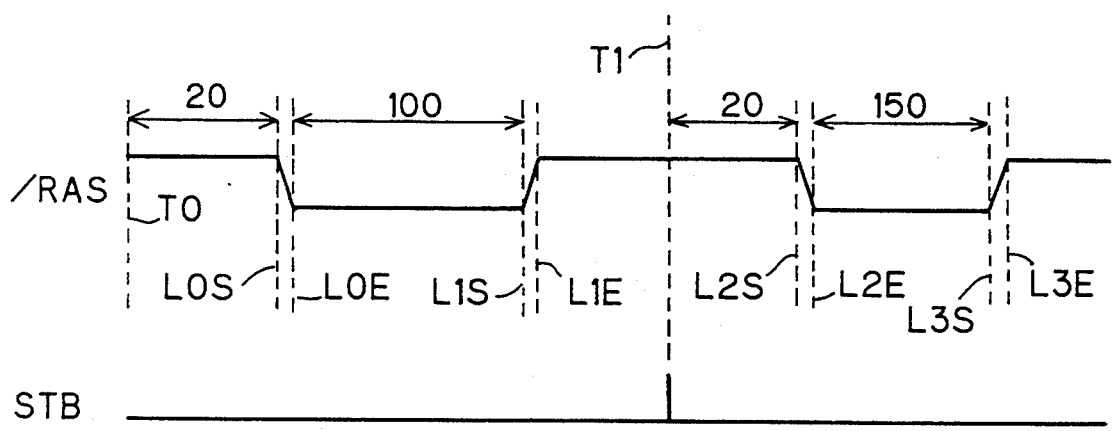
FIG. 11 is an explanatory diagram showing a waveform and timings to thereby explain timing division.
FIG. 12 shows data as obtained by expressing the waveform and the timings of FIG. 11 in the form of the product inspection specification data.

FIGS. 11 to 13 show an example of timing division to be carried out in Step S22. FIG. 12 shows a part of the product inspection specification data stored in the store unit 13 of FIG. 2. FIG. 11 is an explanatory diagram showing waveforms and timings which correspond to the data shown in FIG. 12. Regarding the strobe signal STB, FIG. 11 shows only a strobe signal STB which appears first and omits the other strobe signals STB which are to be derived later. The numerical value "20" appearing between the leader-to-leader lines T0 and LOS is found from the SETTIME of FIG. 12. In other words, the statement "SETTIME/RAS 20" of FIG. 12 means that the signal/RAS starts rising "20"-time, or 20 ns for instance, from the test start timing. For this reason, the numerical value "20" (ns) is inserted between the leader-to-leader line T0 which indicates the test start timing of a test cycle No. 0 and the leader-to-leader line LOS which indicates the start timing of the rise of the signal/RAS.

The strobe signal STB is used as the reference signal for the timing division. Hence, the timing of the strobe signal STB is, in fact, the test start timing of a test cycle No. 1. Since the timing of the strobe signal STB is the test start timing of the test cycle No. 1, by using the SETTIME, a time duration between the leader-to-leader line T1 and the adjacent leader-to-leader line L2S is found to be 20 (ns), the leader-to-leader line T1 being indicative of the test start timing of the test cycle No. 1 and the leader-to-leader line L2S being indicative of the start timing of a fall of the signal /RAS. The leader-to-leader lines T0 and T1 are added in FIG. 11 just for convenience of explanation, while the definitions of the leader-to-leader lines LOS to L3E remain as what has been described earlier.

FIG. 13 shows what the intermediate data would be after the timing division. The timings prescribed in the intermediate data are determined from the test start timing. For example, the statement "RASS0=20 ns" means that the signal /RAS starts falling 20 ns from the test start timing in the test cycle No. 0, while the statement "RASE0=123 ns" means that the signal /RAS starts rising 123 ns from the test start timing in the test cycle No. 0. In the example of FIG. 12, a transient time (e.g., LOS-LOE time) is 3 ns which is needed for a fall or a rise of a signal to complete. The transient time, dependent on various factors such as a type of a tester and the magnitude of an input voltage, is inputted and stored in advance. The statement "RASS1=20 ns" means that the signal/RAS starts falling 20 ns from the test start timing in the test cycle No. 1, while the statement "RASE1=173 ns" means that the signal /RAS starts rising 173 ns from the test start timing in the test cycle No. 1.

In Step S23 (FIG. 10), the tester restriction check is carried out. At the same time, the test program is checked to identify input errors of the product inspection standards. For example, it is found whether a necessary statement is absent or an overlapping statements has been entered with respect to the same matter although it is unnecessary. The check is carried out in accordance with the check data stored in the check data file 15. FIG. 14 is an explanatory diagram showing an example of the check data. The check data of FIG. 14 is data needed for the tester restriction check. Now, assume that there is a restriction that an address signal (e.g., ROW and COL) must be generated 10 ns or more from the end of a test cycle or 10 ns or more before the beginning of a test cycle in operating a certain type of a tester. In this case, a condition $\alpha \leq 10$ ns is a check item. Hence, data defining the check item is stored in the check data file 15 in advance.

Figures 15, 16:
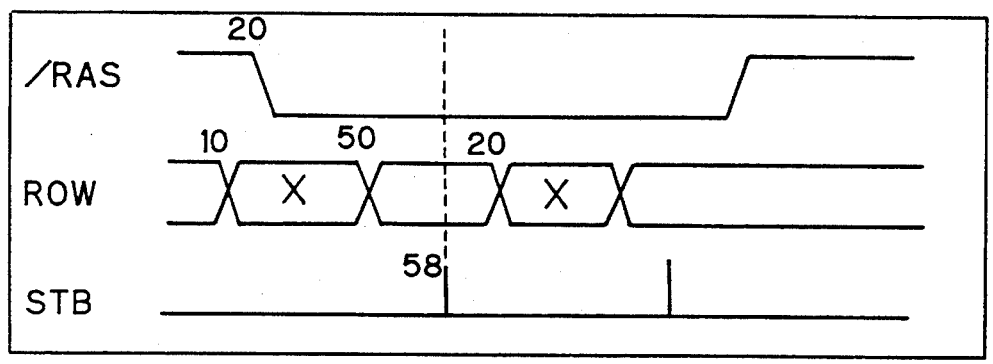
FIG. 15 is an explanatory diagram for explaining a case in which the tester restriction becomes unsatisfied as a result of timing division.
FIG. 16 shows intermediate data which results by the timing division of the FIG. 15 and with which a test program cannot pass a tester restriction check.

In Step S24, the result of the check carried out in Step S23 is judged. Step S28 is performed next if the test program is found to satisfy the check item. Otherwise, the operation flow advances to Step S25. FIG. 15 illustrates where the test program has not passed the tester restriction check. The numerical values attached to the waveforms each indicate a time duration elapsed from the zero-time (test start timing). In FIG. 15, timing division takes place when the strobe signal STB to which the numerical value "58" is attached is derived. Hence, it is 20 (ns) from the timing of the strobe signal STB with the numerical value "58" attached thereto that the address signal ROW starts to be generated for the first time after the timing of the timing division. Now, the earlier of the two test cycles before and after the timing division will be explained (which is on the left side to the strobe signal STB with the numerical value "58"). In this test cycle, the timing to judge readout data (i.e., test end timing) is 58 (ns) from the zero-time as determined by the strobe signal STB. On the other hand, the address signal ROW stops to be generated 50 (ns) from the zero-time. Hence, the relation between the timing of the signal ROW and the test end timing is $\alpha = 8$ (ns), which clearly disagrees with the relation $\alpha \leq 10$ ns. Thus, the timings are found to be inappropriate in the check.

FIG. 16 shows intermediate data which corresponds to the data shown in FIG. 15. In FIG. 16, the statement "RASS0=20 ns" means that the signal/RAS starts falling 20 ns from the test start timing in the test cycle No. 0, while the statement "ROWS0=10 ns" means that the address signal ROW starts to be generated 10 ns from the test start timing in the test cycle No. 0. The statement "ROWE0=50 ns" means that the address signal ROW stops to be generated 50 ns from the test start timing in the test cycle No. 0. The statement "STB0=58 ns" means that readout data is detected 58 ns from the test start timing in the test cycle No. 0. The statement "RATE0=58 ns" means that it is 58 ns from the beginning to the end of the test cycle No. 0. In other words, the time duration of the test cycle No. 0 (i.e., test cycle length, referred to as "RATE") is 58 ns. The statement "ROWS1=20 ns" means that the address signal ROW starts to be generated 20 ns from the test start timing in the test cycle No. 1.

When found to be inappropriate in the check in Step S24, the inappropriate timing has to be examined to find whether it can be amended so that the test program passes the check (Step S25 (FIG. 10)). If it is judged in Step S25 that the amendment of only the inappropriate timings would allow the program as a whole to pass the check, Step S26 is carried out next wherein the inappropriate defective timing is amended. FIG. 17 shows an example of the amendment. In the intermediate data as shown in FIG. 16, the timing "ROWE0" and the test cycle length "RATE0" are in the relation $\alpha = 8$ ns. Thus, the relation $\alpha \leq 10$ ns, or the tester restriction is not satisfied. To rectify this, the test cycle length RATE is extended by 2 ns (10 ns—8 ns). As a result, the intermediate data as amended (FIG. 17) includes amended statements "RATE0=60 ns" and "ROWS1=18 ns," whereby the relation between the test cycle length "RATE0" and the timing "ROWE0" becomes $\alpha = 10$ ns. Hence, the test program satisfies the tester restriction ($\alpha = 10$ ns). Although causing a reduction in the value of "ROWS1" in the test cycle No. 1 from 20 ns to 18 ns, the amendment does not create any problem since the tester restriction ($\alpha \leq 10$ ns) remains satisfied.

On the other hand, it is found in Step S25 that the amending of the defective timing results in another defective timing, the test program is impossible to amend. For example, if the time duration "ROWS1" becomes 9 ns by amending the data as shown in FIG. 16 to the data as shown in FIG. 17, the tester restriction ($\alpha \leq 10$ ns) thereby becoming unsatisfied, the operation flow advances to Step S27 to notify the engineer as such through error output so that the engineer ends the operation. The program then terminates (Step 28).

If the test program is amended in Step S26 or if the test program is found to include no error in Step S24, Step S28 is carried out. In Step S28, the intermediate data as shown in FIGS. 13 or 17 is outputted from the intermediate data generation unit 16 to the store unit 17 where it is stored.

A translator 19 then converts the format of the intermediate data as stored in the store unit 17 into a test program format acceptable to a semiconductor tester of a particular type. Different semiconductor testers require different test program formats. Hence, format conversion of the intermediate data must be ensures that the resulting format is acceptable to the particular semiconductor tester. For this reason, format conversion data which defines the details of format conversion is prepared beforehand and stored in a format conversion data file 18. In accordance with the format conversion data, the translator 19 converts the format and finalizes the test timing program in the form of source program which is acceptable to the particular semiconductor tester. The source program is then stored in a source program store unit 20. Thereafter, the source program thus produced in an automatic manner is compiled as is customarily done in the art, whereby the object program of the test timing condition setting program is produced. As heretofore described coding and editing, which usually require manual labor of the programming engineer are omitted in the present invention. Thus, the present invention promises a large reduction in both programming time and the number of programming errors.

While the invention has been shown and described in detail, the foregoing description is in all aspects illustrative and not restrictive. It is understood that numerous modifications and variations can be devised without departing from the scope of the invention.

What is claimed is:

1. An automatic test timing condition setting program generator for automatically generating a test timing condition setting program which defines a test timing condition of a test program for a semiconductor device, comprising:

input means for inputting product inspection specification data, said product inspection specification data being data describing to a timing of test signals which are given to said semiconductor device during a test of said semiconductor device, said product inspection specification data including set time data which defines a test start timing;

memory means for storing information about a predetermined check item regarding which said product inspection specification data is checked;

intermediate data generating means for checking said product inspection specification data which is inputted using said input means with regard to said check item which is stored in said memory means and, when said check item is satisfied, converting said product inspection specification data into intermediate data in accordance with said set time data, said intermediate data being written in terms of timing in which said test start timing is used as a reference timing; and conversion means for converting a format of said intermediate data into a test program format acceptable to a particular semiconductor tester thereby producing a source program of said test timing condition setting program.

2. A device of claim 1, further comprising another memory means for storing format conversion data defining details of format conversion, wherein.

said conversion means converts said format of said intermediate data into said test program format in accordance with said format conversion data stored in said another memory means.

3. A device of claim 1, wherein said semiconductor device comprises a memory integrated circuit.

4. A device of claim 1, wherein said input means includes a waveform input editor for inputting waveforms of said test signals, said waveforms of said test signal being inputted as image information;

inspection standard information is attached to each one of said waveforms inputted as image information using said input means, said inspection standard information being indicative of a time duration between preselected timings; and said waveform input editor generates said product inspection specification data in accordance with said inspection standard information.

5. A device of claim 4, wherein
said waveform input editor comprises:
an input unit for inputting data on said waveforms and inspection standard information; and
a product inspection specification generating unit for generating said product inspection specification data in accordance with said data on said inspection standard information inputted through said input unit.

6. A device of claim 5, wherein
said product inspection specification generating unit further generates product inspection specification waveform data which is data on said waveforms to which said inspection standard information is attached.

7. A device of claim 1, wherein
said test signals include a reference signal designated as a reference for timing division; and
said intermediate data generating means carries out timing division of said test signals in such a manner that a timing of said timing division is in accordance with a timing of said reference signal, and generates said intermediate data suitable to said test signals.

8. A device of claim 7, wherein said intermediate data generating means checks said product inspection specification data for each said test signals as timing-divided to find whether said check item is satisfied, and if said check item is not satisfied, amends said product inspection specification data so that said check item can be satisfied and then produces said intermediate data.

9. A device of claim 7, wherein said reference signal comprises a strobe signal.

* * * * *